(12) United States Patent
Cheng et al.

(10) Patent No.: US 8,772,143 B2
(45) Date of Patent: Jul. 8, 2014

(54) FIELD EFFECT TRANSISTOR DEVICES WITH DOPANT FREE CHANNELS AND BACK GATES

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,927

(22) Filed: Nov. 14, 2012

(65) Prior Publication Data

US 2014/0134826 A1    May 15, 2014

(51) Int. Cl.
*H01L 21/22*    (2006.01)
(52) U.S. Cl.
USPC .................................. 438/558; 257/E21.561
(58) Field of Classification Search
USPC ............................ 438/558; 257/506, 510, 374
See application file for complete search history.

(56) References Cited

U.S. PATENT DOCUMENTS

| | | | |
|---|---|---|---|
| 5,898,203 A * | 4/1999 | Yoshitomi et al. | ............. 257/344 |
| 6,037,620 A | 3/2000 | Hoenigschmid et al. | |
| 6,133,610 A | 10/2000 | Bolam et al. | |
| 6,214,698 B1 | 4/2001 | Liaw et al. | |
| 7,163,899 B1 | 1/2007 | Cho et al. | |
| 7,410,862 B2 * | 8/2008 | Cheng | ........................... 438/243 |
| 8,008,138 B2 | 8/2011 | Cheng et al. | |
| 2002/0022308 A1 * | 2/2002 | Ahn et al. | ...................... 438/164 |
| 2011/0169089 A1 * | 7/2011 | Doris et al. | ................... 257/350 |
| 2011/0227159 A1 | 9/2011 | Chan et al. | |

OTHER PUBLICATIONS

K. Cheng, et al. "Extremely thin SOI (ETSOI) technology: Past, present, and future," 2010 IEEE International SOI Conference (SOI), Oct. 11-14, 2010, 4 pages.
A. Khakifirooz et al., "Scalability of Extremely Thin SOI (ETSOI) MOSFETs to Sub-20-nm Gate Length," IEEE Electron Device Letters, vol. 33, Issue 2, Feb. 2012, pp. 149-151.
M. Khater, et al., "FDSOI CMOS with dielectrically-isolated back gates and 30nm LG high-y/metal gate," 2010 Symposium on VLSI Technology (VLSIT) Jun. 15-17, 2010, pp. 43-44.
A. Majumdar, et al., "Undoped-Body Eztrememly Thin SOI MOSDETs With Black Gates," IEEE Transactions on Electron Devices, vol. 56, Issue 10, Oct. 2009, pp. 2270-2276.

* cited by examiner

*Primary Examiner* — Reema Patel
(74) *Attorney, Agent, or Firm* — Cantor Colburn LLP; Vazken Alexanian

(57) ABSTRACT

A method of forming a back gate transistor device includes forming an open isolation trench in a substrate; forming sidewall spacers in the open isolation trench; and using the open isolation trench to perform a doping operation so as to define a doped well region below a bottom surface of the isolation trench that serves as a back gate conductor, wherein the sidewall spacers prevent contamination of a channel region of the back gate transistor device by dopants.

11 Claims, 6 Drawing Sheets

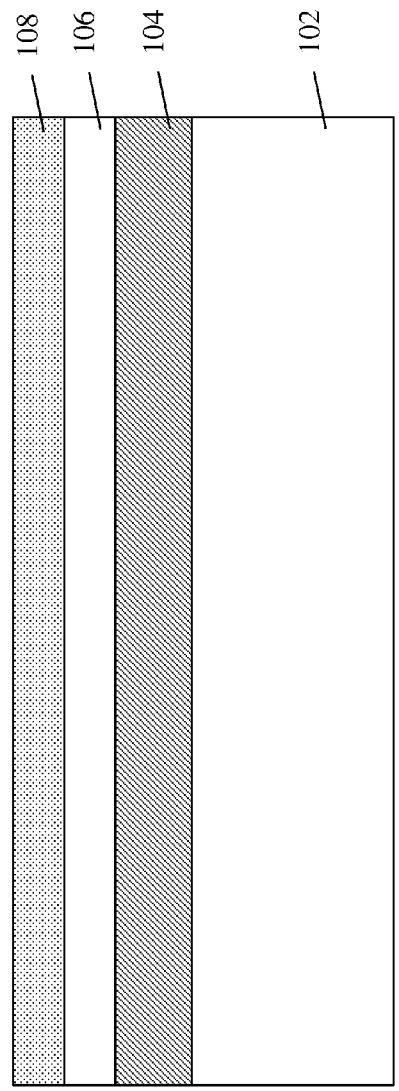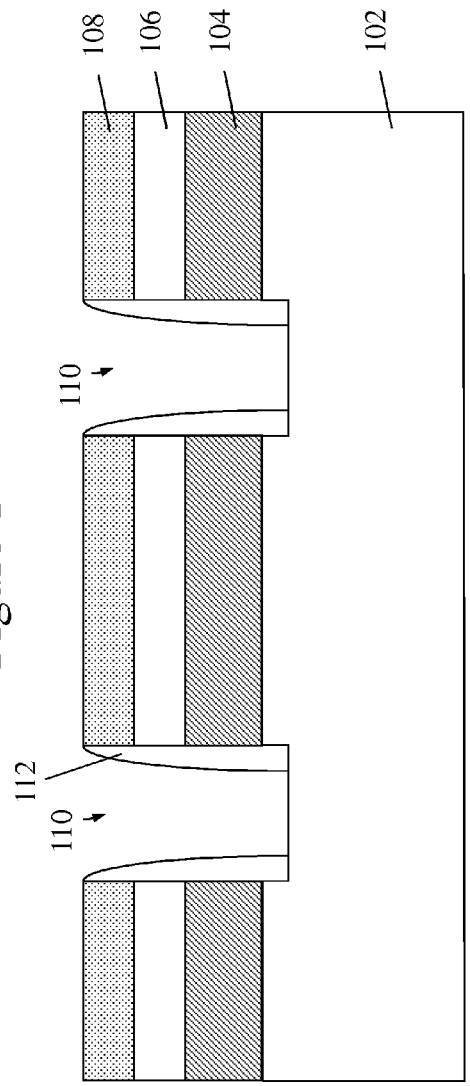

FIELD EFFECT TRANSISTOR DEVICES WITH DOPANT FREE CHANNELS AND BACK GATES

BACKGROUND

The present invention relates generally to semiconductor device manufacturing techniques and, more particularly, to forming improved back gate field effect transistor (FET) devices by using shallow trench isolation (STI) regions to introduce back gate dopant material.

Semiconductor-on-insulator (SOI) devices, such as silicon-on-insulator devices, offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of latch up, which is often exhibited by complementary metal-oxide semiconductor (CMOS) devices, may be avoided when circuit devices are manufactured using SOI fabrication processes. SOI devices are also less susceptible to the adverse effects of ionizing radiation and, therefore, tend to be more reliable in applications where ionizing radiation may cause operation errors.

On the other hand, SOI devices generally suffer from floating body effects. The body of an SOI FET stores electrical charge as a function of the history of the device, thus changing the body voltage accordingly and becoming a "floating" body. As such, an SOI FET has threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in an SOI field effect transistor are particularly a concern in static random access memory (SRAM) cells, where Vt matching is extremely important as operating voltages continue to be scaled down.

An evolution beyond the standard FET (which has a single top gate that controls the FET channel) is the double-gated FET, in which the channel is confined between a top and a bottom gate. Positioning the channel between a top gate and a bottom gate allows for control of the channel by the two gates from both sides of the channel, reducing short channel effects. Further, a double-gated FET may exhibit higher transconductance and reduced parasitic capacitance as compared to a single-gated FET. The presence of the back gate allows for enhanced on-chip power management and device tuning. Multiple threshold voltage (Vt) devices may also be achieved on a single IC chip by applying different back biases at the back gates of various devices.

SUMMARY

In an exemplary embodiment, a method of forming a back gate transistor device includes forming an open isolation trench in a substrate; forming sidewall spacers in the open isolation trench; and using the open isolation trench to perform a doping operation so as to define a doped well region below a bottom surface of the isolation trench that serves as a back gate conductor, wherein the sidewall spacers prevent contamination of a channel region of the back gate transistor device by dopants.

In another embodiment, a method of forming a back gate transistor device includes forming a protective pad layer over a semiconductor-on-insulator (SOI) substrate, the SOI substrate having a bulk substrate layer, a buried insulator (BOX) layer formed on the bulk substrate layer, and an active SOI layer formed on the buried insulator layer; forming an open isolation trench through the protective pad layer, the active SOI layer, the BOX layer, and into a portion of the bulk substrate layer; forming sidewall spacers in the open isolation trench; and using the open isolation trench to perform a doping operation so as to define a doped well region below a bottom surface of the isolation trench and the BOX layer, such that the doped well region serves as a back gate conductor, wherein the sidewall spacers prevent contamination of the BOX layer and the active SOI layer device by dopants.

In another embodiment, a back gate transistor device includes a semiconductor-on-insulator (SOI) substrate, the SOI substrate having a bulk substrate layer, a buried insulator (BOX) layer formed on the bulk substrate layer, and an active SOI layer formed on the buried insulator layer; an isolation trench formed through the active SOI layer, the BOX layer, and into a portion of the bulk substrate layer; sidewall spacers formed in the open isolation trench; at least a portion of the isolation trench filled with a dopant source insulator material; and a doped well region disposed below a bottom surface of the isolation trench and the BOX layer, the doped well region configured as a back gate conductor, wherein dopants from the doped well region originate from the dopant source insulator material.

BRIEF DESCRIPTION OF THE SEVERAL VIEWS OF THE DRAWINGS

Referring to the exemplary drawings wherein like elements are numbered alike in the several Figures:

FIGS. 1 through 8 are a series of cross sectional views illustrating a method of forming a back gate ETSOI device in accordance with an exemplary embodiment, in which:

FIG. 1 illustrates the formation of a protective pad layer over an ETSOI substrate;

FIG. 2 illustrates the formation of STI trenches within the substrate of FIG. 1 and the formation of sidewall spacers within the STI trenches;

FIG. 3 illustrates filling of the STI trenches of FIG. 2 with a dopant source insulator material;

FIG. 4 illustrates optional recessing of a portion of the dopant source insulator material, and replacement with an undoped insulator material;

FIG. 5 illustrates a thermal anneal of the structure of FIG. 4, resulting in the formation of a doped well region in the bulk substrate layer beneath the BOX layer;

FIG. 6 illustrates planarization of the structure of FIG. 5 to remove the protective pad layer;

FIG. 7 illustrates an expanded view of the structure of FIG. 6, including the formation of an adjacent doped well region of an opposite polarity type;

FIG. 8 illustrates the formation of back gate transistor devices using the structure of FIG. 7;

FIGS. 9 through 12 are a series of cross sectional views illustrating a method of forming a back gate ETSOI device in accordance with another exemplary embodiment, in which:

FIG. 9 illustrates the formation of STI trenches within the substrate of FIG. 1 and the formation of sidewall spacers within the STI trenches;

FIG. 10 illustrates the formation of a doped well in the bulk substrate layer beneath the BOX layer of FIG. 9;

FIG. 11 illustrates an expanded view of the structure of FIG. 10, including the presence of a protective layer over an adjacent region of the substrate for which a doped well region of an opposite polarity type is to be formed;

FIG. 12 illustrates the filling of deep trench isolation regions and shallow trench isolation regions of the structure of FIG. 11 with a same insulator material.

DETAILED DESCRIPTION

Figure 3:
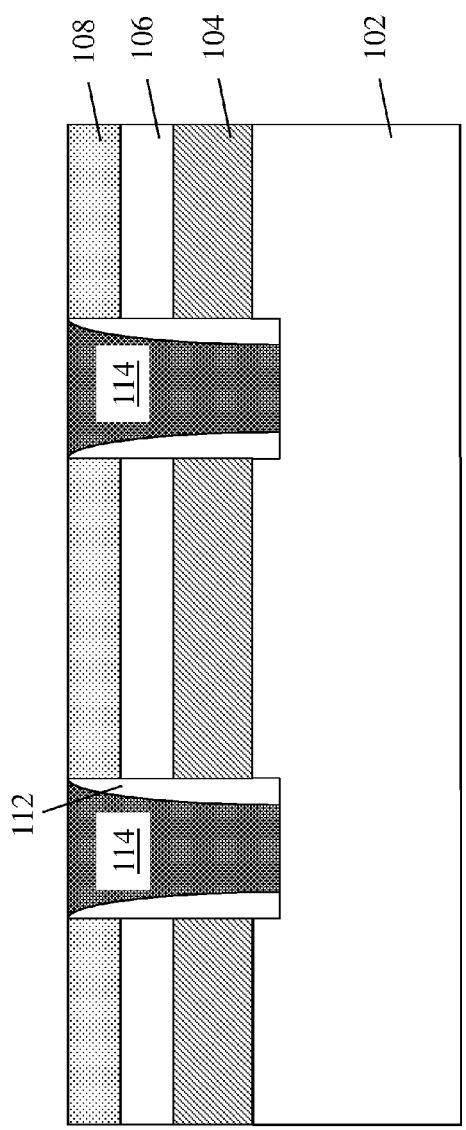

Ultrathin body MOSFETs, such as ETSOI (extremely thin SOI) devices, are considered viable options for CMOS scaling for the 22 nanometer (nm) node and beyond. ETSOI with a back gate bias (as described above) has been touted as a potential device option for future CMOS. In such a structure, the back bias is implemented by a back gate that comprises a doped region below the buried oxide (BOX) layer. Typically, the doped region defining the back gate is formed by dopant implantation directly through the ETSOI layer, the BOX layer, and into the bulk substrate. However, such an implantation approach has several drawbacks. First, implantation straggling may create undesired residual dopants in the active SOI layer, which adversely increases device variability. Second, the implantation into the BOX layer may cause defects therein and increase the etch rate of the BOX layer during device fabrication, in turn creating potential shorts between the SOI layer above the BOX layer and the bulk substrate below the BOX layer.

Accordingly, disclosed herein are methods and corresponding structures for forming ETSOI back gate regions without the problems described above. In one embodiment, the back gate region is formed by filling an open STI trench with a doped material and diffusing the dopants from the doped STI into the bulk substrate. In another embodiment, dopants may be directly implanted into the bulk substrate through the open STI trench.

Referring initially to FIGS. 1 through 8, there are shown a series of cross sectional views a method of forming a back gate ETSOI device in accordance with an exemplary embodiment.

As shown in FIG. 1, an ETSOI substrate includes a bulk semiconductor layer 102, a buried insulator (e.g., oxide) (BOX) layer 104 formed on the bulk semiconductor layer 102, and an active ETSOI layer 106 formed on the BOX layer 104. A protective pad layer 108 (e.g., oxide, nitride, etc.) is also shown formed over the ETSOI layer 106. The semiconductor substrate material of the bulk layer 102 and/or the ETSOI layer 106 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

In addition, while the exemplary embodiments are described in terms of an ETSOI thickness device (e.g., the ETSOI layer 106 is on the order of about 10 nanometers (nm) or less), it should be appreciated that the principles described herein are equally applicable to substrates of varying materials and thicknesses.

FIG. 2 illustrates the formation of STI trenches 110 within the substrate of FIG. 1. Specifically, the STI trenches 110 are defined through the protective pad layer 108, the ETSOI layer 106, the BOX layer 104, and slightly into a portion of the bulk semiconductor layer 102. The STI trenches 110 may be formed, for example, by photolithographic patterning and successive etching of the layers. As also shown in FIG. 2, the STI trenches 110 are further provided with sidewall spacers 112, such as a nitride material for example.

Figure 4:
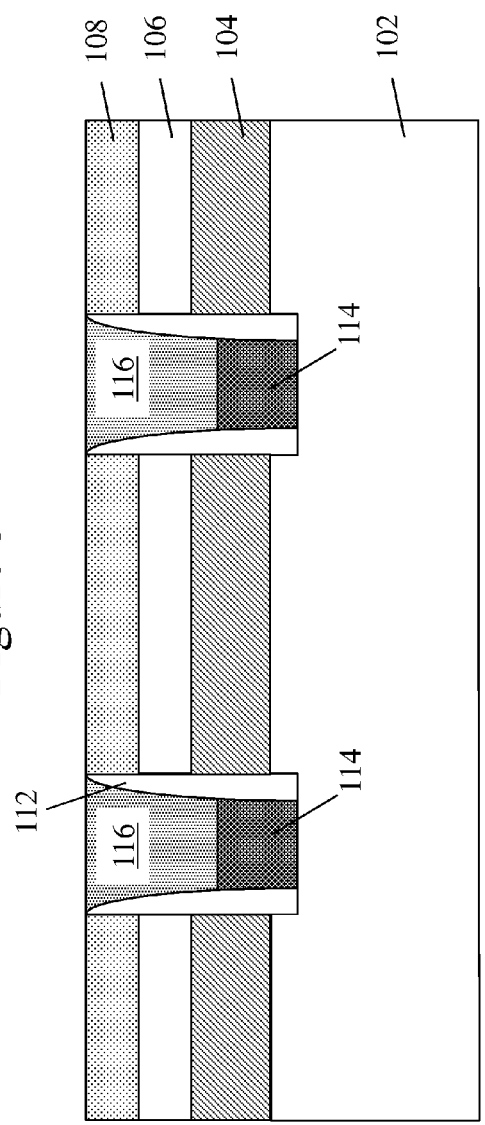

Following the spacer formation, FIG. 3 illustrates filling of the STI trenches 110 with a dopant source insulator material 114, which material will provide the source of dopant atoms for the back gate region. The specific selection for the dopant source insulator material 114 depends on whether the desired polarity of the back gate device is n-type or p-type. Suitable examples of the dopant source insulator material 114 include, but are not limited to, boron-doped oxide, arsenic-doped oxide, and phosphorous-doped oxide. Because the dopant materials are intended to be located within the bulk semiconductor layer 102, the entire height of the STI trenches 110 need not be completely filled with the dopant source insulator material 114. Accordingly, FIG. 4 illustrates an optional recessing of a portion of the dopant source insulator material 114, and replacement of the same with an undoped insulator material 116 such as oxide for example. In the example depicted, the dopant source insulator material 114 may be recessed below the bottom surface of the ETSOI layer 106. In an exemplary embodiment, the undoped insulator material 116 may be formed by a high density plasma deposition, followed by chemical mechanical planarization/polishing (CMP).

Figure 5:
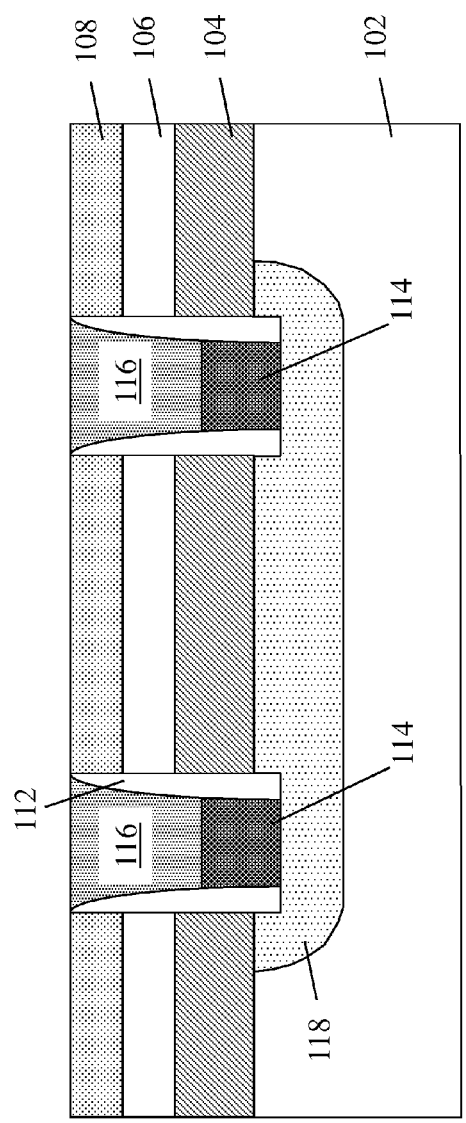
Figure 6:
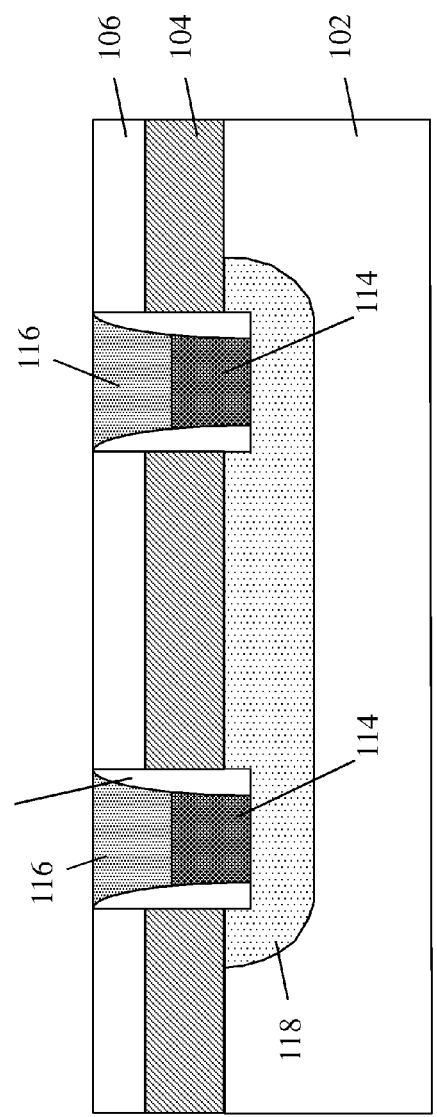

Referring now to FIG. 5, a thermal anneal of the structure of FIG. 4 is performed so as to result in the formation of a doped well region 118 in the bulk substrate 102 layer beneath the BOX layer 104. Notably, the presence of the sidewall spacers 112 (and optional undoped insulator material 116) prevents dopant diffusion from the dopant source insulator material 114 into the ETSOI layer 106 or the BOX layer 104. Once the structure is planarized to remove the protective pad layer 108 as shown in FIG. 6, device processing may continue to form back gate devices. In contrast to the aforementioned technique of implanting a doped well region directly through SOI and BOX layers, here the contamination of the ETSOI layer 106 and the BOX layer 104 is prevented by using the STI trenches to deliver the dopant material into the bulk substrate 102 layer.

Figure 7:
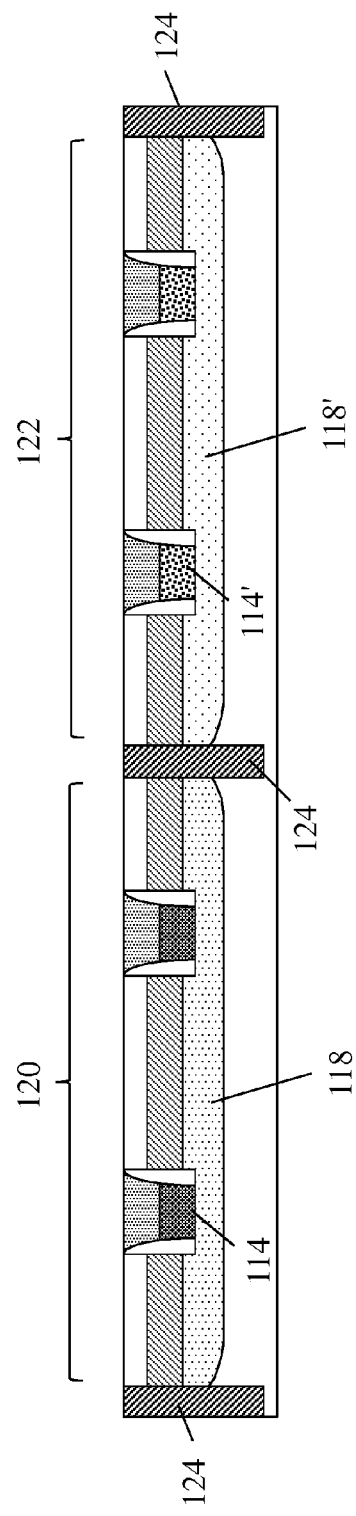
Figure 8:
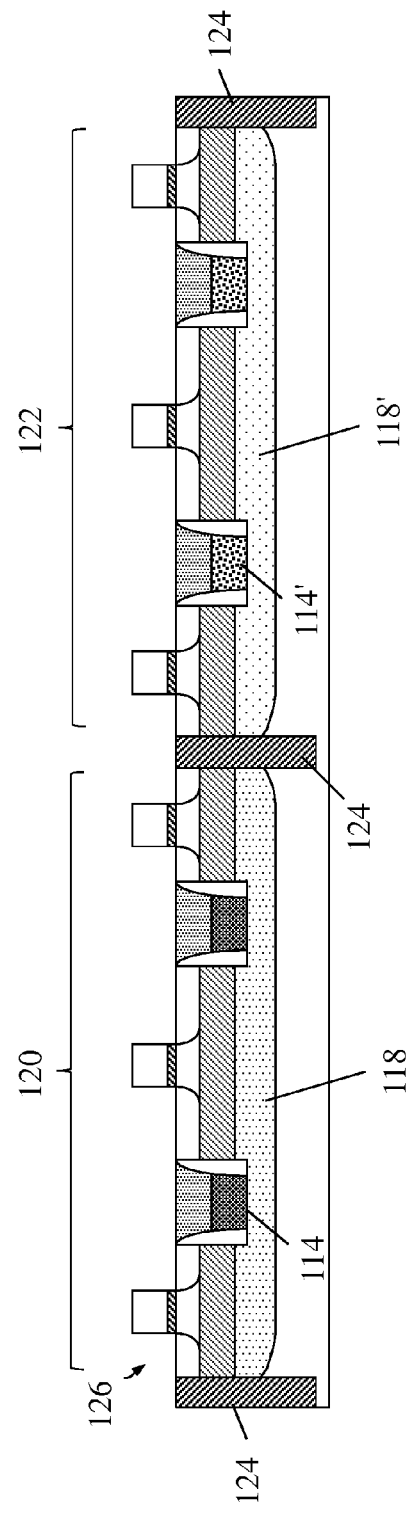

By way of further illustration, FIG. 7 is an expanded view of the structure of FIG. 6, which also depicts the formation of an adjacent doped well region of an opposite polarity type and/or dopant concentration. In this specific example, region 120 represents a p-type region wherein the doped well region 118 is a p-well region. Here, the dopant source insulator material 114 may include a boron-doped oxide for example. Conversely, region 122 represents an adjacent p-type region wherein the doped well region 118' is an n-well region. In this case, the dopant source insulator material 114' may include an arsenic-doped oxide or a phosphorous-doped oxide for example. As further shown in FIG. 7, adjacent n-wells and p-wells are isolated from one another by deep trench isolation regions 124. FIG. 8 then illustrates the formation of back gate transistor devices 126 using the structure of FIG. 7.

In lieu of leaving a dopant source insulator material in at least a portion of the STI regions, other doping techniques are also contemplated with respect to using the open STI trenches. In this regard, FIGS. 9 through 12 are a series of cross sectional views illustrating a method of forming a back gate ETSOI device in accordance with another exemplary embodiment. For ease of description, like elements are identified with similar reference numbers in this embodiment.

Figure 9:
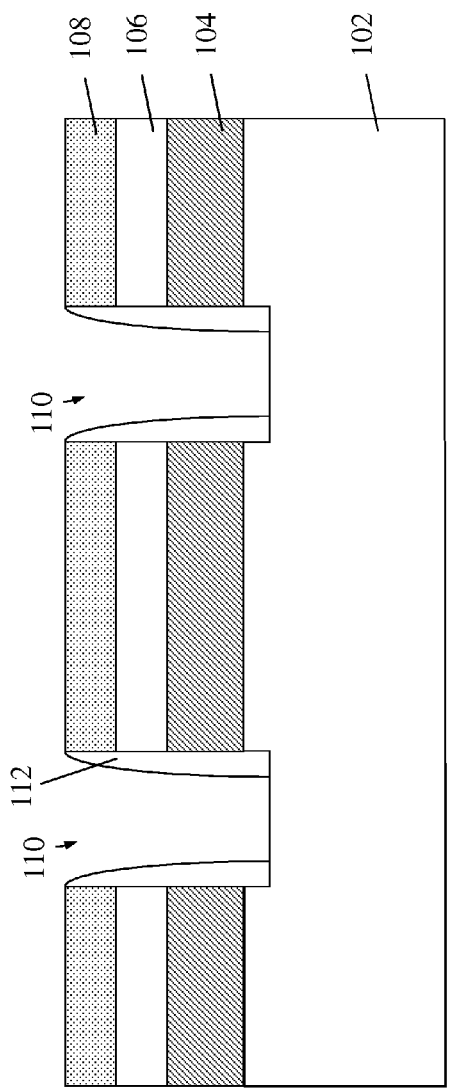
Figure 10:
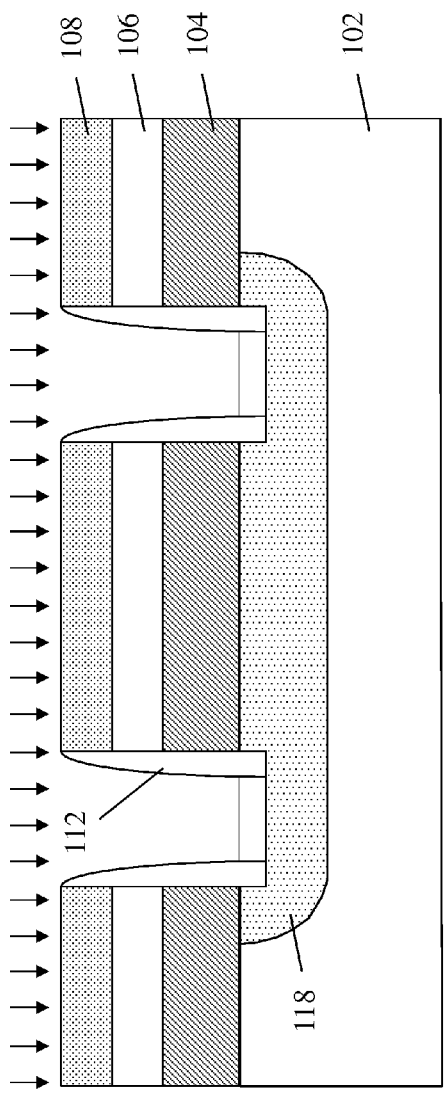

FIG. 9 illustrates the formation of STI trenches 110 within the substrate of FIG. 1 and the formation of sidewall spacers 112 within the STI trenches 110, similar to the view presented in FIG. 2. In FIG. 10, a doped well 118 is formed in the bulk substrate layer beneath the BOX layer of FIG. 9. Notably, no dopant source insulator material is present in the STI trenches 110 after the doped well formation. In one embodiment, this may be implemented by a doping technique (indicated by the arrows) such as, for example, plasma doping, plasma immersion doping, and gas phase doping, etc. In another embodiment, the dopant source insulator and anneal technique of FIGS. 3-5 could also be used. However, instead of leaving the dopant source insulator material in the trenches 110, the doped material may then be stripped so as to result in the intermediate structure illustrated in FIG. 10.

Figure 11:
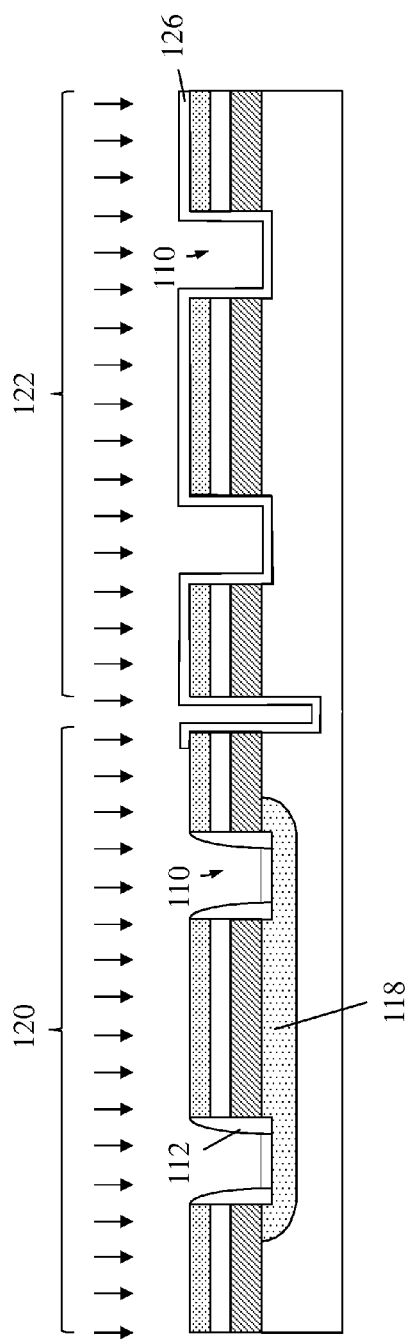

Referring now to FIG. 11, there is shown an expanded view of the structure of FIG. 10, including the presence of a protective layer 126 over an adjacent region of the substrate for which a doped well region of an opposite polarity type is to be formed. For example, during the formation of the doped well 118 in region 120 of the device, the protective layer 126 (e.g., a hardmask) remains over region 122 of the device during formation of the spacers 112 so that only the STI bottoms corresponding to locations where the well regions are to be formed are exposed. Then, to form a corresponding well in region 122, the protective layer 126 is removed and another protective layer (not shown) is selectively formed over the trenches 110 in region 120 so that a corresponding spacer and doping process may be performed for region 122.

Figure 12:
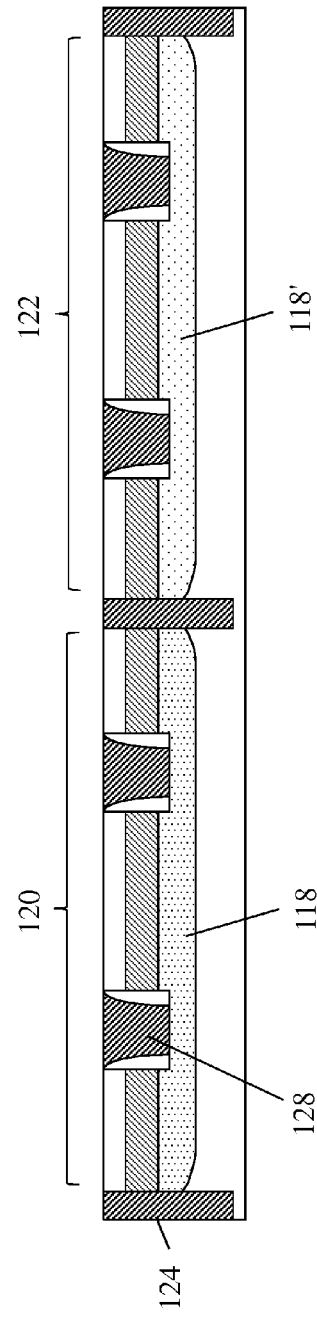

Finally, as illustrated in FIG. 12, once complementary polarity well regions 118 and 118' have been formed, all of the trenches (including shallow and deep trench isolation regions) are filled with a same insulator material, such as an oxide for example. As will thus be appreciated, by performing back gate doping following STI definition, the above described embodiments avoid previous issues of BOX and ETSOI dopant defects.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of forming a back gate transistor device, the method comprising:
    forming an open isolation trench in a substrate;
    forming sidewall spacers in the open isolation trench; and
    using the open isolation trench to perform a doping operation so as to define a doped well region below a bottom surface of the isolation trench that serves as a back gate conductor, wherein the sidewall spacers prevent contamination of a channel region of the back gate transistor device by dopants;
    wherein the performing the doping operation further comprises forming a dopant source insulator material within the open isolation trench, performing an annealing operation so as to drive dopants from the dopant source insulator material into the substrate, and performing one of:
    recessing a portion of the dopant source insulator material and replacing the same with an undoped insulator material prior to performing the annealing operation; or
    completely removing the dopant source insulator material following the annealing operation.

2. The method of claim 1, wherein the doped well region comprises a p-type region, and the dopant source insulator material comprises boron-doped oxide.

3. The method of claim 1, wherein the doped well region comprises an n-type region, and the dopant source insulator material comprises one or more of arsenic-doped oxide and phosphorous-doped oxide.

4. The method of claim 1, wherein the substrate comprises a semiconductor-on-insulator (SOI) substrate having a bulk substrate layer, a buried insulator (BOX) layer formed on the bulk substrate layer, and an active SOI layer formed on the buried insulator layer.

5. The method of claim 4, wherein the SOI substrate comprises an extremely thin SOI (ETSOI) substrate, with the active SOI layer having a thickness of about 10 nanometers (nm) or less.

6. The method of claim 4, wherein the open isolation trench is formed completely through the active SOI layer and the BOX layer, and into a portion of the bulk substrate layer such that the sidewall spacers prevent contamination of the active SOI layer and the BOX layer by the dopants.

7. A method of forming a back gate transistor device, the method comprising:
    forming a protective pad layer over a semiconductor-on-insulator (SOI) substrate, the SOI substrate having a bulk substrate layer, a buried insulator (BOX) layer formed on the bulk substrate layer, and an active SOI layer formed on the buried insulator layer;
    forming an open isolation trench through the protective pad layer, the active SOI layer, the BOX layer, and into a portion of the bulk substrate layer;
    forming sidewall spacers in the open isolation trench; and
    using the open isolation trench to perform a doping operation so as to define a doped well region below a bottom surface of the isolation trench and the BOX layer, such that the doped well region serves as a back gate conductor, wherein the sidewall spacers prevent contamination of the BOX layer and the active SOI layer device by dopants;
    wherein the performing the doping operation further comprises forming a dopant source insulator material within the open isolation trench, performing an annealing operation so as to drive dopants from the dopant source insulator material into the bulk substrate layer, and performing one of:
    recessing a portion of the dopant source insulator material and replacing the same with an undoped insulator material prior to performing the annealing operation; or
    completely removing the dopant source insulator material following the annealing operation.

8. The method of claim 7, further comprising refilling the open isolation trench with an undoped insulator material.

9. The method of claim 7, wherein the doped well region comprises a p-type region, and the dopant source insulator material comprises boron-doped oxide.

10. The method of claim 7, wherein the doped well region comprises an n-type region, and the dopant source insulator material comprises one or more of arsenic-doped oxide and phosphorous-doped oxide.

11. The method of claim 7, wherein the SOI substrate comprises an extremely thin SOI (ETSOI) substrate, with the active SOI layer having a thickness of about 10 nanometers (nm) or less.

* * * * *